(12) United States Patent
De et al.

(10) Patent No.: US 9,032,339 B2
(45) Date of Patent: May 12, 2015

(54) RANKING VERIFICATION RESULTS FOR ROOT CAUSE ANALYSIS

(71) Applicant: Synopsys, Inc., Mountain View, CA (US)

(72) Inventors: Kaushik De, Bangalore (IN); Kevin M. Harer, Cornelius, OR (US); Rajarshi Mukherjee, Bangalore (IN); Mahantesh Narwade, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/786,599

(22) Filed: Mar. 6, 2013

(65) Prior Publication Data

US 2014/0258954 A1 Sep. 11, 2014

(51) Int. Cl.
*G06F 17/50* (2006.01)

(52) U.S. Cl.
CPC .................................. *G06F 17/504* (2013.01)

(58) Field of Classification Search
CPC ........................... G06F 17/504; G06F 17/5068
USPC ............................. 716/50–56, 106–115, 136
See application file for complete search history.

(56) References Cited

U.S. PATENT DOCUMENTS

| | | | |
|---|---|---|---|
| 6,704,912 B2 * | 3/2004 | Narain et al. | 716/106 |
| 7,350,168 B1 | 3/2008 | Mathur et al. | |
| 7,383,168 B2 | 6/2008 | Mukherjee et al. | |
| 7,415,684 B2 | 8/2008 | Harer et al. | |
| 7,454,727 B1 | 11/2008 | Cerny et al. | |
| 7,797,123 B2 | 9/2010 | De et al. | |
| 8,302,044 B2 | 10/2012 | Moon et al. | |
| 8,347,240 B2 | 1/2013 | Agarwal et al. | |
| 8,347,246 B2 | 1/2013 | Ouyang et al. | |
| 2007/0079266 A1 * | 4/2007 | Devineni et al. | 716/5 |
| 2007/0101303 A1 * | 5/2007 | Lien et al. | 716/5 |
| 2009/0319252 A1 | 12/2009 | De et al. | |
| 2012/0109749 A1 | 5/2012 | Subramanian et al. | |
| 2012/0198397 A1 | 8/2012 | Moon et al. | |
| 2012/0227022 A1 | 9/2012 | De et al. | |
| 2012/0253754 A1 | 10/2012 | Goswami et al. | |
| 2013/0007678 A1 | 1/2013 | Yang et al. | |
| 2013/0275933 A1 * | 10/2013 | Hsu et al. | 716/109 |

* cited by examiner

*Primary Examiner* — Nha Nguyen
(74) *Attorney, Agent, or Firm* — Adams Intellex, PLC

(57) ABSTRACT

Verification-result ranking techniques for root cause analysis are disclosed using violation report analysis and violation weighting. Violation reports are unwieldy and result from a variety of design and process checks. The check coverage can overlap, causing a specific violation to trigger multiple reported violations. High turn around times for violation report analysis increase the risk that selective violation analysis will inadvertently suppress real design bugs. This reduces the odds that static checker reports alone will meet design sign-off criteria. Determining relationships among a plurality of violations for a design permits clustering violations into hot spots. Identification of primary and subsequent contributors to the plurality of violations is based on the relationships among violations. The hot spot with the highest weight is identified, and then subsequent violations are identified to maximize violation coverage. The result is greater efficiency of design violation identification and resolution.

30 Claims, 7 Drawing Sheets

RANKING VERIFICATION RESULTS FOR ROOT CAUSE ANALYSIS

FIELD OF ART

This application relates generally to design verification analysis and more particularly to ranking verification results for root cause analysis.

BACKGROUND

Integrated circuits are ubiquitous in modern electronic devices and systems. These devices and systems are highly complex and are very difficult to design and manufacture. The designs routinely involve tens, hundreds, or even thousands of people, distributed geographically and across many time zones. The devices and systems are manufactured via a complicated, multi-step process including photolithographic printing and chemical processing, along with many handling steps. The number of manufacturing steps can run easily into the thousands. Modern systems contain a variety of circuits, including digital, analog, and high frequency components, which further complicates the design and manufacturing processes. Feature sizes of the circuitry that make up modern devices and systems are now routinely smaller than the wavelength of visible light. As feature sizes of the components continue to decrease, more circuitry and features are added into the designs. For example, device counts for logic systems commonly run to the tens or hundreds of millions of active devices (e.g. transistors). In addition, the rapid changes in market demand drive ever-increasing circuit performance and device count, chip feature sets, system versatility and flexibility, and a variety of other system demands. These demands impose often-contradictory requirements on the design process, making the design process highly complex and expensive. Each design decision has a profound impact on the resulting device or system design. Requirements regarding system performance, physical size, architectural complexity, power consumption, heat dissipation, fabrication complexity and cost, for example, influence a design. To handle electronic system design complexity, designers create a design specification to which their electronic systems are designed. The specification is created to balance the many disparate system demands required of the electronic system, and to contain otherwise exploding design complexity. For a design to be considered valid, that design must match the numerous and diverse requirements of the design's specification.

Verifying that a design matches its system specification is a highly complex and time-consuming process. Static verification tools are routinely employed to test designs against a specification. In part, static testing is becoming increasingly complex because system size and design complexity continue to grow. In addition, different design techniques, methodologies, and standards require tests which cater to different systems requirements. As a result, static test tools often find and report copious numbers of violations. The violations may be due to design errors, design violations, process violations, and so on. Reports of violations at a block level may run to tens of thousands of violations, while reports for full chips may run to the millions of violations. Analysis and validation of reports from static verification tools pose challenges because of the sheer volume of data that must be handled and analyzed. Rapid turn around time (TAT) is key in bringing a design to market, so expedient analysis of the static checker report of violations is critical to the design process. Verification of static check violation reports is often a key design sign-off criterion. Thus, designers need to selectively analyze violations—basing their violation selections on an educated guess or previous experience—in order to analyze the violations based on the severity of a report and the relative importance of a check. This process is time consuming and tedious, and as a result, the values of the many other checks performed by the static tool remain undermined, opening the designer to the risk that he or she chose to analyze the incorrect violations and thus suppressed the discovery of an actual design bug. In addition, it is imperative that analysis of violations generated by the static tool be performed in a computationally efficient and cost effective manner.

SUMMARY

Techniques to improve the evaluation accuracy and computational efficiency of violation identification techniques, along with methods to aid the resolution of reports generated by static verification tools are implemented. Static verification reports are ranked and ordered by design object and by design attribute hot spots. A violation hot spot is a violation of design rules, design processes, process rules, and so on—including design objects and design attributes which appear in multiple violations. A violation hot spot represents a related group of violations which are grouped together. Each violation hot spot shows information about requisite violations which share common design objects and design attributes. Such information permits a designer to more easily debug a design by examining all reported violations from a design-centric point of view. The designer is then able to visualize and analyze all violations on design objects and design attributes of a hot spot to identify a common root cause or plurality of root causes. Violation waivers also may be applied more efficiently to rapidly manage large violation reports by focusing quickly on critical, highly ranked violations. A computer-implemented method for design analysis is disclosed comprising: obtaining a report on violations for a design; determining a relationship between a plurality of the violations for the design; and identifying a primary contributor to the plurality of the violations based on the relationship between the plurality of violations.

The design may include information on a specification. The specification may include intent on power and/or timing. The specification may include one or more of UPF or SDC. The primary contributor may be related to an object or an attribute within the design. The primary contributor may be based on a frequency of violations relating to an object within the design. The primary contributor may be based on a weighting of an object or an attribute within the design. The identifying a primary contributor may be based on a hot spot analysis for the design. The method may further comprise determining a root cause for the plurality of violations. The method may further comprise evaluating the design with a static checker. The static checker may identify at least some of the violations for the report. The violations may be from one or more static verification tools. The method may further comprise presenting the plurality of violations based on the relationship. The identifying the primary contributor may be based on data mining. The method may further comprise determining weights for aspects of the violations. The weights may be for debug fields. The method may further comprise calculating violation weights. The violation weights may be based on the weights for the aspects of the violations. The method may further comprise sorting the violations based on the violation weights. The primary contributor may be related to an object or an attribute within the design and the sorting of the violations aids in identifying the primary contributor, wherein the primary contributor is further based on a frequency of violations relating to the object or the attribute within the design. The violation weights may be based on a context factor. The violation weights may be based on a number of violations associated with an object in the design. The violation weights may be based on a number of violations associated with an attribute in the design.

In embodiments, a computer-implemented method for semiconductor design analysis may comprise: obtaining a report on violations for a design wherein the report describes problems within the design; determining a relationship between a plurality of the violations within the report for the design wherein the relationship includes a physical or logical proximity between the plurality of violations; and identifying a primary contributor to the plurality of the violations based on the relationship between the plurality of violations wherein the primary contributor is related to an object or an attribute within the design. In some embodiments, a computer system for design analysis may comprise: a memory which stores instructions; one or more processors coupled to the memory wherein the one or more processors are configured to: obtain a report on violations for a design; determine a relationship between a plurality of the violations for the design; and identify a primary contributor to the plurality of the violations based on the relationship between the plurality of violations. In embodiments, a computer program product embodied in a non-transitory computer readable medium for design analysis may comprise: code for obtaining a report on violations for a design; code for determining a relationship between a plurality of the violations for the design; and code for identifying a primary contributor to the plurality of the violations based on the relationship between the plurality of violations.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
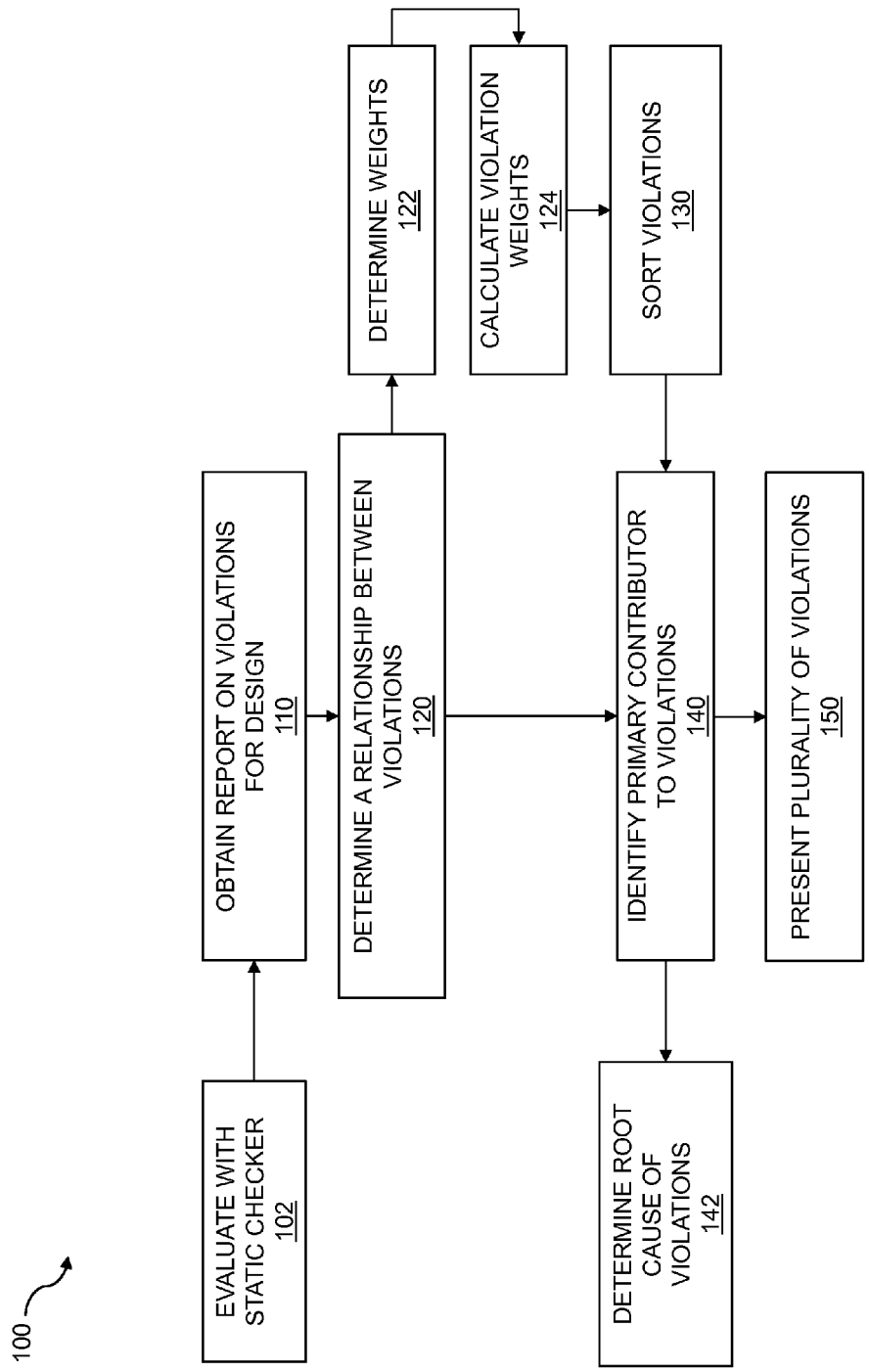
FIG. 1 is a flow diagram for analyzing verification results.

Modern electronic devices and systems are routinely constructed from numerous semiconductor circuits and systems. The circuits or "chips" are composed of tens or even hundreds of millions of transistors organized into logic circuits, subsystems, systems, analog circuits, mixed signal, and even high frequency components. Static verification tools are used to determine whether a given electronic device or system matches a specification to which it is designed and ultimately built. Static verification tools typically apply many tests or checks to the circuit design or device design which is under test. As design size and complexity continue to increase, more checks are added. Some of the new checks cater to different design requirements, such as new or different design techniques, design methodologies, and design standards, for example. Adding further complexity, the test results from previously existing checks and the added checks are not necessarily independent. Previous checks and added checks may overlap in terms of circuit coverage, the context of the circuit being tested, and the like. As a result of this overlap of checks, a given design error, design process violation, process violation, and the like, may manifest itself in a variety of the validation checks.

Static verification tools execute the many validation checks required by the design specification for the circuit or system being tested. Validation is a critical criterion for signoff or final approval of a design. The static verification tools generate unstructured verbose, often complex reports. While the numbers of violations generated and reported by design checks at a subsystem or at a block level may run to the tens of thousands, the number of violations reported based on checks of a full chip may run into the millions. The violations reported refer to design errors, design process violations, process violations, and so on. The resulting large volume of violation information must be analyzed to identify the sources of the violation errors. The variety of checks complicates the designer's task of determining the sources of the violations as each violation must be validated based on the different checks and in various contexts. Validation is further complicated by the various market demands pushing for rapid chip design turnaround times.

Analysis and validation of the reports generated by static verification tools pose complex challenges such as managing large reports and debugging violations from a variety of checks with overlapping, differing contexts. Because of the demand for short design turnaround times, analysis and verification of static verification tool reports must be computationally efficient and effective in coverage and resolution. Often, certain aspects of a given design cause the static verification tool to generate an excessively long and detailed violation report. Since the scope of each check performed by the tool is usually narrow enough to support high accuracy, a single root cause error may be reflected as violations to several checks. The massive amounts of data in the violation reports must be examined and analyzed by the designers in a timely manner, thus forcing the designers to find ways to prioritize the violations. The prioritizations are based on violation severity, relative importance of the check that generated the violation, a priori experience of the designer, and so on. In addition, the checkers may also provide violation waiver techniques to further manage the volume of violation data. Effective application of any waiver or plurality of waivers is critical. The waivers may be used to indicate that a given violation generated by a check is not important in a given context, for example. However, selective analysis and application of waivers to violations reported by some of the checks may undermine the value of other checks. In fact, incorrectly set waiver for one check may suppress the discovery of a real error which would have been revealed by another check of a design.

In the disclosed concept, efficient analysis and validation of static verification tool violation reports is performed based on violation hot spots. Examining, analyzing and weighting violation data in the reports derive violation hot spots. Violations of verification checks share many design objects and design attributes. A violation hot spot represents a violation with design objects and design attributes which appear in a maximum number of violations. Each violation hot-spot report shows information pertinent to contributing violations sharing common design objects and design attributes. A weight is calculated for the violations or debug fields referenced in static check violation reports. A violation weight is calculated as the sum of the weights of its debug fields. The validation hot spot is identified by sorting violations in descending order of weights such that the violation with the maximum weight is the first violation hot spot report thereby allowing identification of a portion of the design not in compliance with certain requirements. Subsequent violation hot spot reports are ranked such that different debug fields maximize coverage of the remaining violations. Identification of violation hot spots permits a design-centric view of the violation report data, thus enabling a designer to rapidly and efficiently debug a design. All violations on design objects and design attributes within a hot spot are reported. The hot spots allow the designer to visualize and analyze all check violations that derive from the same design objects and design attributes, and thus rapidly identify root causes and effective waiver application. Analyzing design objects and design attributes that possess the maximum number of violations allow for faster design convergence.

FIG. 1 is a flow diagram for handling circuit design verification. A flow 100 describes a computer-implemented method for static verification analysis where the analysis includes check violation reports. The flow 100 includes obtaining a report 110 on violations for a design. A violation report may be imported or extracted, generated by a static checker, generated by another computer-implemented tool, or otherwise obtained. The violations may be from one or more static verification tools. The report on violations comprises violations to various checks made of the circuit or system being designed and under test. The violations report comprises results of checking, and may include violations to individual checks or a plurality of checks. The report on violations may run to millions of entries. Static checkers are used to verify that an electronic device or system meets the requirements of a system specification. The flow 100 further comprises evaluating a design with a static checker 102. A static checker executes various tests or checks based on design checks derived from an electronic device or system specification. Static checking may be used to verify a digital device or system design. The static checker may be used to check that a design meets logical, thermal, power, and timing design objectives, for example. Static checking may also be used to verify that a circuit meets design flow requirements, fabrication requirements, and the like. The static checker may identify at least some of the violations for the report. A report listing various types of violations may be generated as a result of the static checking. The report may include data on violations of a check or a plurality of checks.

The flow 100 includes determining a relationship between a plurality of the violations 120 for the design. Relationships may exist between a plurality of violations indicated by one or more checks. The relationships may be strongly coupled or weakly coupled. Relationships may be identified using data mining techniques or other analysis techniques where large amounts of data are sifted to identify interactions between violations and machine learning techniques may be applied to evaluate the violations. Relationships between violations may be based on design objects or design attributes. The flow may further comprise determining weights 122 for aspects of the violations. The violations may comprise entries in a static check report. Weights may be used to differentiate or prioritize violations to a check or to a plurality of checks. Violations may be analyzed for debugging purposes. The determined weights 122 may be for debug fields within a report or plurality of reports generated by static analysis. Weights may be calculated for a debug field using the number of violations referenced by a debug field, for example. The flow may further comprise calculating violation weights 124. A violation weight may be calculated by the sum of weights for a debug field or a plurality of referenced debug fields. The violation weights may be based on the weights for the aspects of the violations. Aspects of a violation may include design objects, design policies, and so on. The violation weights may be based on a context factor. A context factor may describe how a design object may fit into a larger design. The violation weights may be based on the sum of weights of associated design objects and design attributes. Design objects may include logic gates, subsystem blocks, system blocks, and the like.

The flow may further comprise sorting 130 the violations based on the violation weights. The violations may be sorted in descending order from highest weight to lowest weight. Other sorting schemes may be used. For example, violations may be sorted in ascending order, based on an average value, based on maximum coverage, and so on. Violations with the highest weight may be given priority for further analysis. Highly weighted violations may derive from design errors, design process violations, process violations, and so on.

The flow 100 includes identifying a primary contributor 140 to the plurality of the violations based on the relationship among the plurality of violations. The identifying of the primary contributor 140 may be based on data-mining technology, algorithms, heuristics, or other data analysis techniques. The primary contributor may be based on a weighting of a design object or a design attribute within the design. A root cause error may be a design error, a design process error, a process error, and so on. A root cause error may generate a plurality of violations to a plurality of checks. The primary contributor may be related to a design object or a design attribute within the design. The primary contributor should be considered to be an item that provides the highest debug value or is most important in being able to diagnose a problem with a design. The flow may further comprise determining a root cause 142 for the plurality of violations. A root cause may result from a design error, a design process error, a process error, a configuration error, a context error, and so on.

The flow may further comprise presenting 150 the plurality of violations based on the relationship. The violations that were ranked by weight and grouped into violation hot spots may be presented. The violations may be presented based on a violation number and a check number. The violations may further be presented linked to design objects or design policies that drive the violations, for example. The plurality of violations may be presented by a variety of means including but not limited to a file, a report, a display, a graphical representation, and so on. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
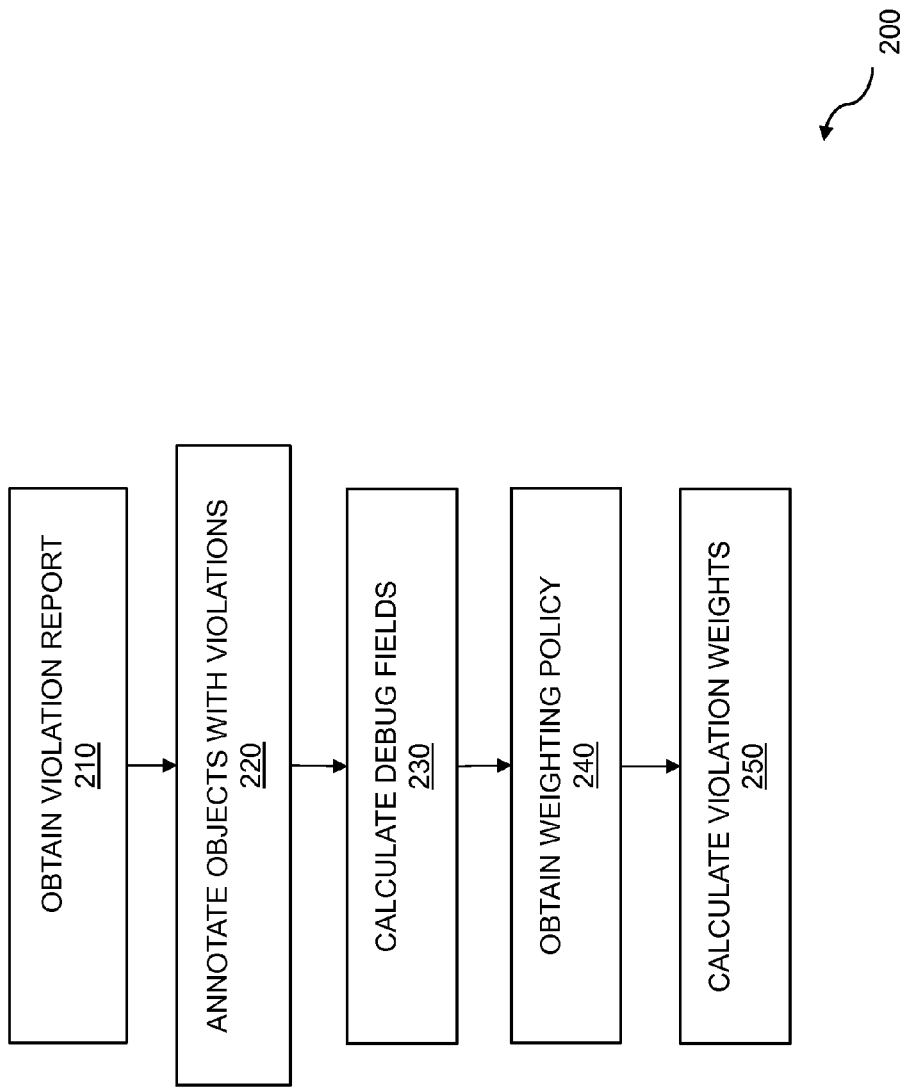
FIG. 2 is a flow diagram for weighting.

FIG. 2 is a flow diagram for weighting. A flow 200 may continue from or be part of a previous flow 100. In some embodiments, the flow 200 may stand on its own and may work from a pre-existing semiconductor chip design violation report or other report. The flow 200 includes obtaining a violation report 210. A violation report may be a collection of violations resulting from checking as part of a verification process. A violation report may be imported or extracted, or may be generated by a static checker, another computer-implemented tool, or otherwise obtained. The violation report may include debug data. The violation report may identify a primary contributor to a violation or plurality of violations.

The primary contributor may be based on a frequency of violations relating to an object within the design. The violations of checks may be due to design errors, design policy violations, process violations, and so on. The violations may be due to design objects, design attributes, and so on.

The flow 200 further comprises annotating objects with violations 220. Violations may be imported, extracted, generated by a static checker, and so on. Violations result from design checks. A design may comprise design objects, design policies, domain information, connection information, and so on. Objects and policies may be linked across domains. Violations may be extracted from a violation report. Violations may be related to checks, design objects, policies, and the like. Annotating objects may include selecting violations and checks, and associating those violations and checks with an object. The annotating may refer to a specific violation and an associated check. For example, a certain violation may be associated with a specific check. Multiple violations and multiple checks may occur.

The flow 200 further comprises calculating debug fields 230. Debug fields may be identified based on associated violations and checks, design objects, policies, and so on. Debug fields may be calculated for a given violation and its associated check. The debug fields may comprise design objects, design policies, and so on. For example, the violation V5 mentioned earlier may be associated with check C3, and may occur in various design objects and design policies. A debug value may be based on the numbers of occurrences of a violation-check pair or tuple that occurs in its associated design objects and design policies.

The flow 200 further comprises obtaining a weighting policy 240. Weights may be assigned to the values calculated for the debug fields of a violation report. A policy may be obtained and applied to determine how the weighted values may best be used for validation purposes and the like. For example, a weighting policy may be based on adding together debug values for violation-check tuples. Weighting may be based on giving certain violation-check tuples priority based on a highest weight, for example. Other weighting policies may be applied based on lowest weight, average weight, and so on.

The flow 200 further comprises calculating violation weights 250. Violation weights may be calculated by adding debug-field weights together. Debug-field weights may include design object weights, design-policy weights, and so on. For example, the violation V5, associated with check V3, may occur in a variety of design objects and design policies. The numbers of occurrences of the violation-check tuple associated with each design object and design policy may be summed to obtain a violation weight. For example, the violation-check tuple that occurs the most times across associated design objects and design processes would result in the highest weight. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
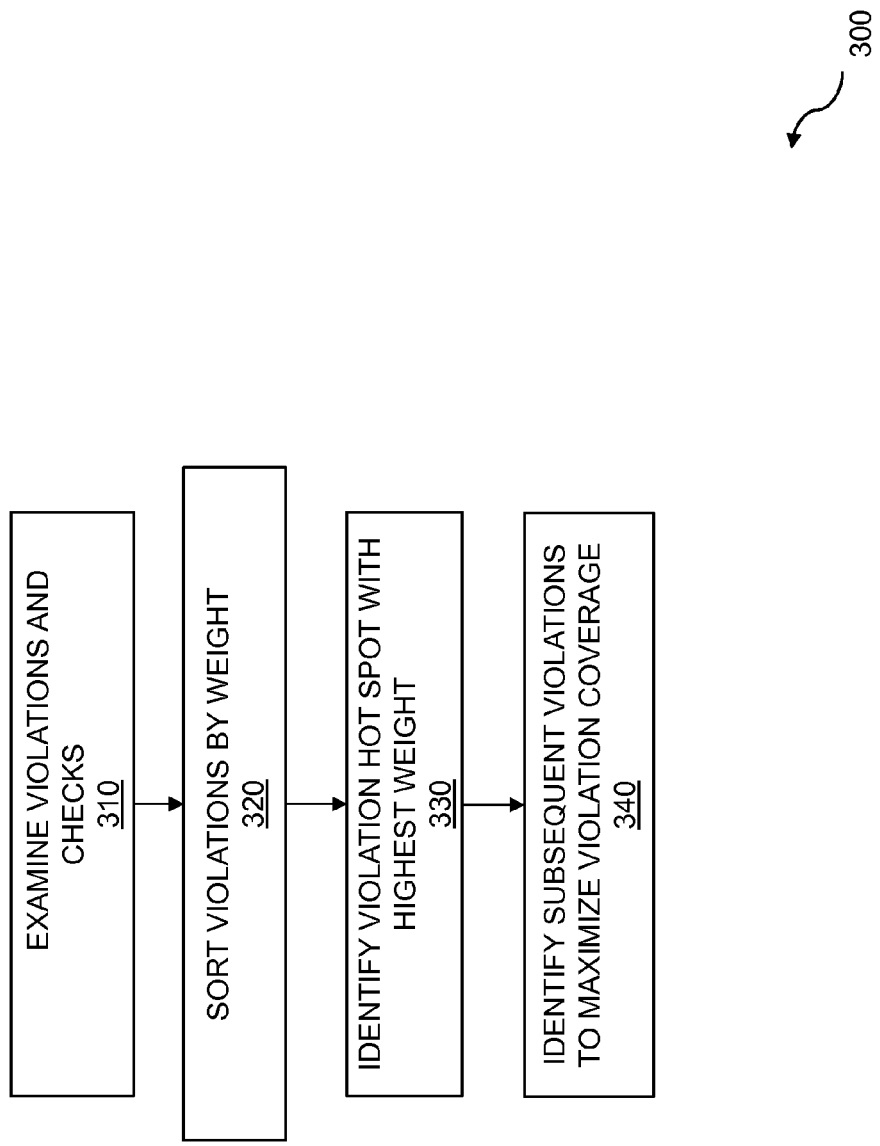
FIG. 3 is a flow diagram for hot spot identification and reporting.

FIG. 3 is a flow diagram for hot spot identification and reporting. A flow 300 may continue from or be part of the previous flow 100 or the previous flow 200. In come embodiments, the flow 300 may stand on its own and may work from a pre-existing semiconductor chip-design violation report or another report. The flow 300 includes examining violations and checks 310. The violations and checks may be considered together as pairs or tuples. A violation-check tuple has a value calculated based on design objects, design policies, numbers of occurrences of a violation-check tuple, and so on.

The flow 300 further comprises sorting violations by weight 320. Violation weights may be calculated based on the number of occurrences of a violation-check tuple throughout a design. The violations may be sorted in ascending order, descending order, based on an average, or other sorting policy appropriate to the area. Various sorting policies may be applied in the event of a weighting tie.

The flow 300 comprises identifying a violation hot spot with a highest weight, 330. The violation with a highest weight may be designated a first violation in the hot spot report. A violation with a highest weight may be chosen based on violation coverage. The first violation hot spot may be used to identify a primary contributor to a hot spot. The identifying a primary contributor may be based on a hot spot analysis for the design. A primary contributor to a violation hot spot may include a design error, a design process error, a process error, and so on.

The flow 300 comprises identifying subsequent violations to maximize violation coverage 340. While the first violation hot spot may be based on the hot spot with the highest weight, this first hot spot may not cover all design violations and object violations of a design. Subsequent violation hot spot reports may be selected to provide greater violation coverage. The number of subsequent violations selected may be chosen to maximize the coverage of violations. By choosing subsequent violations which maximize coverage, violation analysis time may be reduced and analysis efficiency may increase. Various steps in the flow 300 may be changed in order, repeated, omitted, or the like without departing from the disclosed concepts. Various embodiments of the flow 300 may be included in a computer program product embodied in a non-transitory computer readable medium that includes code executable by one or more processors.

Figure 4:
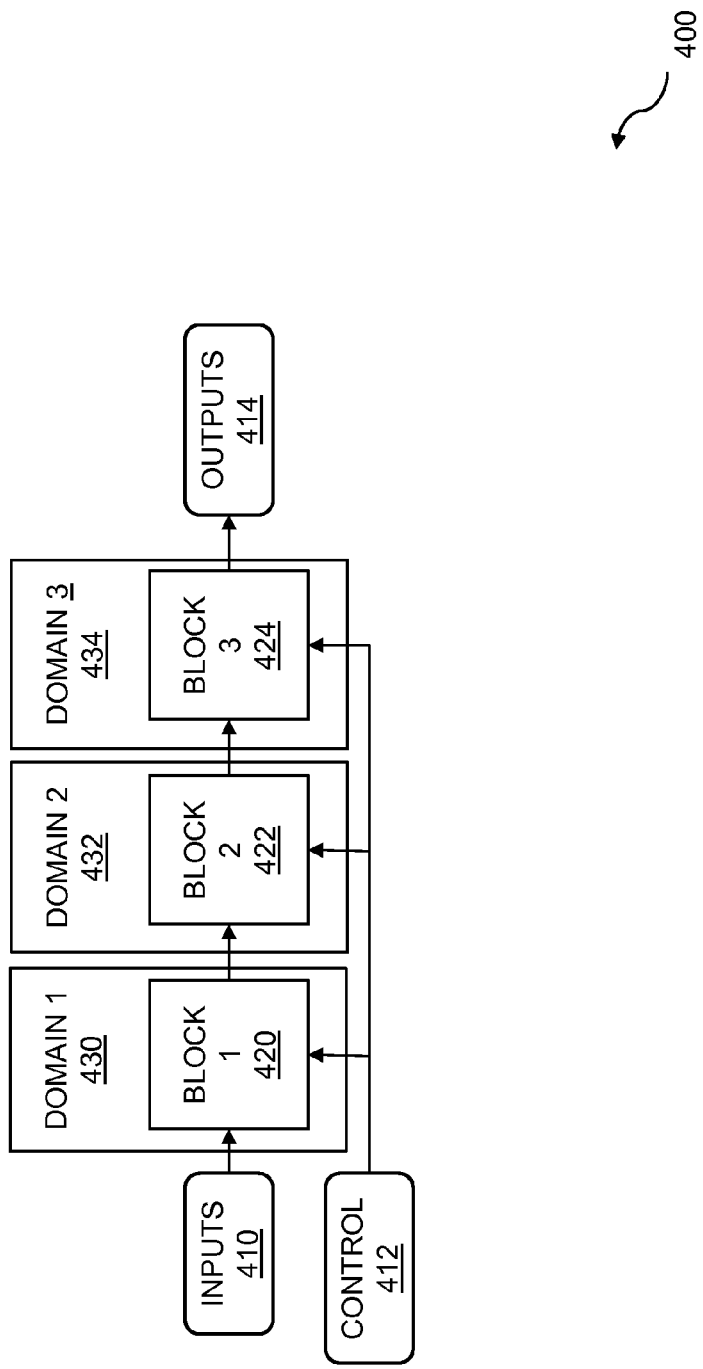
FIG. 4 is an example circuit design showing blocks and domains.

FIG. 4 is an example circuit design showing blocks and domains. An example circuit 400 is shown comprising an input or plurality of inputs 410, an output or plurality of outputs 414, and a control or plurality of controls 412. The example circuit 400 further comprises blocks including Block 1 420, Block 2 422, and Block 3 424. In embodiments, any number of blocks may be represented. A block or plurality of blocks may comprise digital circuits and systems, analog circuits and systems, high frequency circuits and systems, and so on. A block or plurality of blocks may be interconnected. A block or plurality of blocks may be connected to one or more inputs 410, one or more controls 412, one or more outputs 414, and so on.

A circuit or system may be partitioned into domains. Domains may represent a range of convenient partitions into which a device or system may be divided. Domains may be chosen based on a variety of parameters including function of the block or plurality of blocks, types of blocks or a block, restrictions on a block or plurality of blocks, design intents, and so on. The example circuit 400 shows three domains, Domain 1 430, Domain 2 432, and Domain 3 434. In practice, any number of domains may be included. A domain may contain one block or a plurality of blocks. A block may represent a circuit, a subsystem, a system, and so on.

The method by which a block or plurality of blocks may be interconnected may be described by a specification. A specification may include information about block type and composition, block interconnections, block requirements, and so on. The specification may describe various constraints which may be imposed on a design. A specification may be used to convey design intent. The specification may include intent on power and/or timing. For example, a specification may dictate how much power a block or plurality of blocks may consume, or how much heat a block or plurality of blocks may dissipate. A specification may indicate timing requirements or timing restrictions for a block or plurality of blocks in the design. Other design intents may be included in a specification. The specification may include one or more of Unified Power Format (UPF) or Synopsys™ design constraints (SDC). Unified power format may be included in a specification, for example, to describe power consumption and power (heat) dissipation requirements. Synopsys™ design constraints may also be included in a specification. SDC design intent may include synthesis requirements, test requirements, system operating conditions, and so on.

Figure 5:
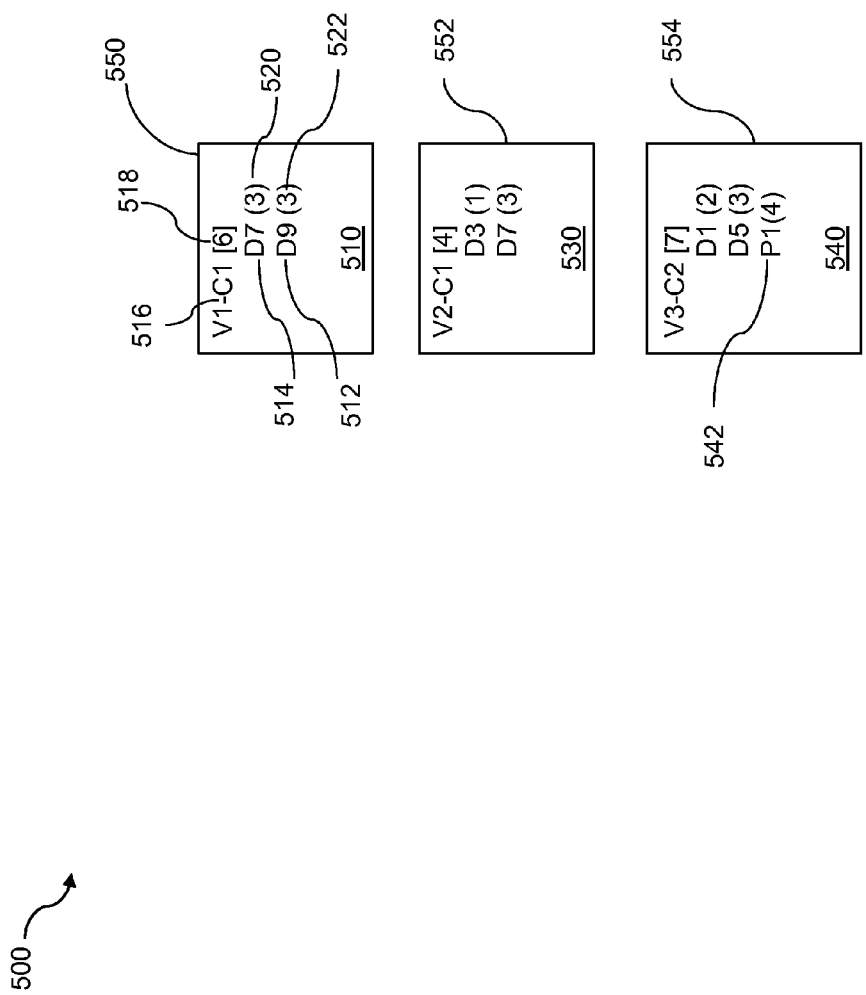
FIG. 5 is an example violation report.

FIG. 5 is an example violation report. An example violation report 500 is shown and comprises violations reported as a result of various checks. The checking may have been performed as part of a design validation process. A violation report may be imported or extracted, may be generated by a static checker or another computer-implemented tool, or may be otherwise obtained. The report on violations 500 for a design may include information on violations and associated checks, design objects, design attributes, design policies, and so on. In the example violation 500, three violation report entries are shown, 510, 530, and 540. Any number of violation report entries may be present, based on the types of violations, types and numbers of checks, design styles, scope of checking, and so on. For example, violation reports may run into the thousands for checking of a subsystem or at the block level, and may run into the millions for system level verification checks.

Three example violation report entries are shown, 510, 530, and 540. An entry may be labeled by a violation-check pair or tuple. One example tuple, V1-C1 (violation 1 check 1) 516 may refer to a violation V1 and a check C1. Other tuples are shown, including V2-C1 (violation 2 check 1), and V3-C2 (violation 3 check 2). In practice, any number of violation-check tuples may be represented in a violation report. A violation report entry may comprise debug fields for design objects, design policies, and so on. For example, violation report entry 510 comprises two design elements, D7 514 and D9 512. Any number of design elements, design policies, and so on, may be present. Violation report entry 540 further comprises a design policy P1 542. As before, any number of design elements, design policies, and the like, may be present.

Design weights may be assigned to fields of a violation report entry. Violation weights may be determined for design objects. The example violation report entry 510 (including tuple V1-C1 516) shows two design objects D7 514 and D9 512. The violation weights may be based on a number of violations associated with an object in the design. In some embodiments, design object D7 514 is associated with other violations throughout a design and appears in other violation report entries. For example, design element D7 514 may appear in a total of three violation report entries, and thus may be assigned a weight of 3 520. Similarly, design element D9 512 may appear in a total of three violation report entries and thus may be assigned a weight of 3 522. Similarly, the violation weights may be based on the number of violations associated with a design attribute. As before, a design attribute may appear in a number of violation report entries, and thus may be weighted by that number of appearances.

Violation weights may be calculated based on debug field weights. Debug field weights for a violation report entry may simply be added together to calculate a violation weight, or other weighting methods may be implemented. Returning to violation report entry 510, debug field weights for design elements may be added together. The weight for design object D7 may be added to the weight for design object D9 to calculate a violation weight. For example, in violation report entry 510 the violation weight 518 for tuple V1-C1 may be calculated to be 6 (calculated by adding the weights of the violations within the tuple: 3+3). Violation weights may be calculated for any number of violation report entries.

Violation report entries may be sorted by violation weights. Various sorting methods may be used including ascending order, descending order, average value, and the like. Sorting may be based on violation coverage. Hot spots may be designated based on the sorting. For example, sorting in descending order the three entries in the violation report example may show three hot spots 554, 550, and 552.

Figure 6:
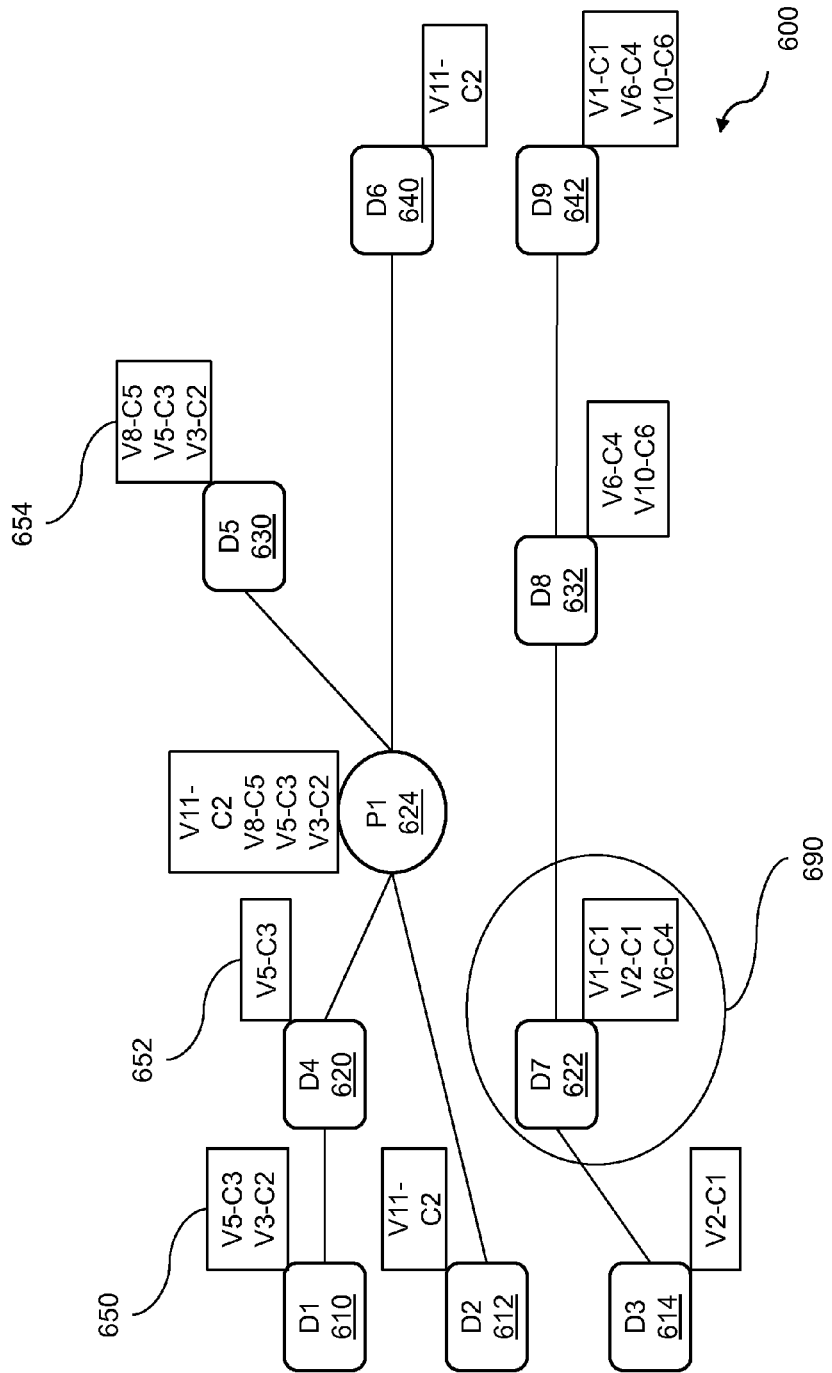
FIG. 6 is an example of annotated design objects with violations.

FIG. 6 is an example of annotated design objects with violations. An example design 600 is shown comprising design objects, design policies, and annotations based on a violation report. The design may include information on a specification. A design may be imported or extracted, may be generated by a computer-aided design tool, or may be otherwise obtained. The specification may include intent on power and/or timing. A design may include domains which may be used to designate logical blocks (portions of a device or system identified as critical to power dissipation), portions of a device or system identified as critical to timing, and so on. A violation report may be imported or extracted, may be generated by a static checker or another computer-implemented tool, or may be otherwise obtained. The report on violations for a design may include information on violations and associated checks, design objects, design attributes, design policies, and so on.

In design 600, an example design comprising design objects and UPF policies is shown. Design objects, for example, D1 610, D2 612, D3 614, D4 620, D5 630, D6 640, D7 622, D8 632, and D9 642 are shown. Design objects may represent digital blocks, subsystems, systems, analog blocks, high frequency blocks, and so on. Various policies may also be represented, for example, policy P1 624. A policy may be a unified power format (UPF) policy, a timing policy, a context, and so on.

A design may be annotated. Annotations may include violation-check tuples identified in a violation report. Violation information may be used to annotate some or all the design objects and design policies. For example, design object D1 610 may be annotated with violation-check tuples 650, including V5-C3 (denoting violation 5 and check 3) and V3-C2; design object D4 620 may be annotated with violation-check tuple 652 including V5-C3; and design object D5 630 may be annotated with violation-check tuples 654 including V8-C5, V5-C3, and V3-C2. Any number of violation-check tuples may be included in an annotation. Other annotation schemes may be possible.

An annotated design may be analyzed with respect to violation-check tuples or pairs. The analysis may include determining a relationship among a plurality of the violations for the design. Violations from, for example, a violation report, may be associated with a plurality of design objects and design policies. Analysis may include tallying the number of times a particular design object is associated with violations. For example, in the example shown, design object D7 has three associated violations 690. A weight may be assigned to a design object based on a number of violations associated with it. Such weights may be used to identify hot spots and may be used as part of hot spot analysis.

Figure 7:
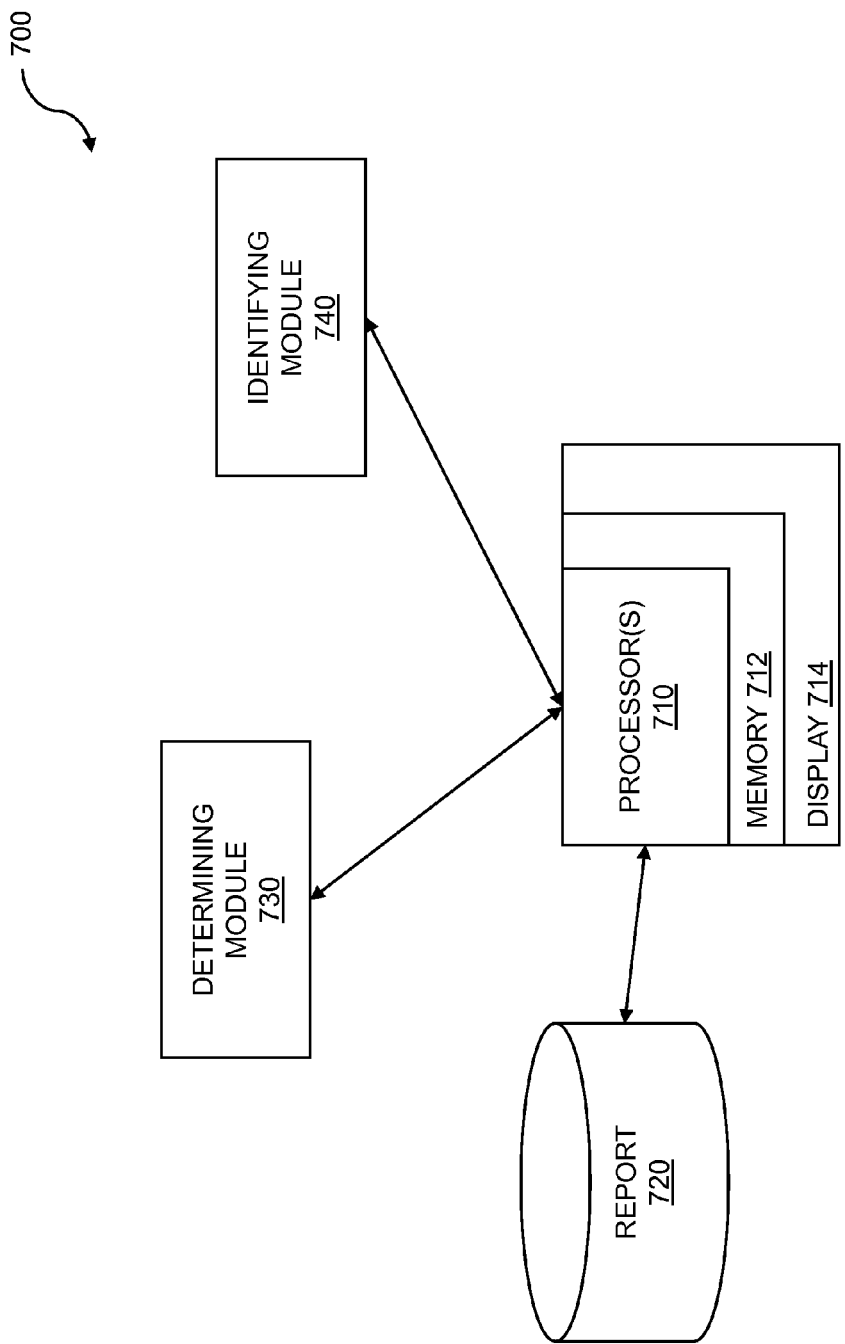
FIG. 7 is a system diagram for ranking verification results.

FIG. 7 is a system diagram for ranking verification results. A system 700 includes one or more processors 710 as well as a determining module 730 and an identifying module 740. The one or more processors 710 are coupled to a memory 712, which can store instructions, and to a display 714. The display 714 may be any electronic display, including but not limited to, a computer display, a laptop screen, a net-book screen, a tablet computer screen, a cell phone display, a mobile device display, a remote with a display, a television, a projector, or the like. The memory 712 may store code, design information, violation report information, debug data, design data, instructions, system support data, intermediate data, analysis results, and the like.

The processors 710 may be configured to access a report 720, the determining module 730, and the identifying module 740. In at least one embodiment, the one or more processors 710 accomplish the functions of the determining module 730 and the identifying module 740. The processors 710 may be configured to obtain a verification report 720 comprising at least one violation. The violation or plurality of violations may be design-rule related, design-process related, fabrication related, and the like. The violation or plurality of violations may result from increasing design size and design complexity. The violation or plurality of violations may result from design checks required for a given technology or for design flow requirements. For example, violations may result from low power, clock domain crossing (CDC), Lint checking for language syntax and semantics, formal analysis, new design and fabrication standards, and other checking. The processors 710 may be configured to determine relationships between and among a plurality of the violations reported for the design. The relationships between and among violations may be based on design violations, design errors, process violations, design flow violations, and the like. Individual violations may be local within a design or may be global across a design. The processors 710 may be configured to identify a primary contributor to the plurality of the violations. The primary contributor to the plurality of violations may be a design violation, design error, process violation, design flow violation, and the like. The identifying may be based on relationships between and among a plurality of violations. The identifying may be based on weights that may be assigned to violations. The system 700 may implement a method for semiconductor design analysis comprising: obtaining a report on violations for a design wherein the report describes problems within the design; determining a relationship between a plurality of the violations within the report for the design wherein the relationship includes a physical or logical proximity between the plurality of violations; and identifying a primary contributor to the plurality of the violations based on the relationship between the plurality of violations wherein the primary contributor is related to an object or an attribute within the design. The system 700 may include a computer program product embodied in a non-transitory computer readable medium comprising: code for obtaining a report on violations for a design, code for determining a relationship between a plurality of the violations for the design, and code for identifying a primary contributor to the plurality of the violations based on the relationship between the plurality of violations.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for design analysis comprising:
    determining, based on a report on violations for a design using one or more processors, a relationship between a plurality of the violations for the design where the relationship includes a proximity between the plurality of violations;
    calculating violation weights and sorting the violations based on the violation weights;
    identifying a primary contributor to the plurality of the violations based on the relationship between the plurality of violations, where the primary contributor is related to an object within the design and where the identifying a primary contributor is based on a hot spot analysis for the design;
    annotating the design with violation-check tuples and where the determining the relationship between the plurality of the violations is based on the violation-check tuples; and
    wherein a weight, from the violation weights, is assigned to a design object based on the number of violations associated with the design object within the design and where the hot spot is identified based on the weight.

2. The method of claim 1 wherein the design includes information on a specification.

3. The method of claim 2 wherein the specification includes intent on power and/or timing.

4. The method of claim 3 wherein the specification includes one or more of UPF or SDC.

5. The method of claim 1 wherein the primary contributor is also related to an attribute within the design.

6. The method of claim 5 wherein the primary contributor is based on a weighting of the object within the design.

7. The method of claim 1 wherein the primary contributor is based on a frequency of violations relating to the object within the design.

8. The method of claim 1 further comprising determining a root cause for the plurality of violations.

9. The method of claim 1 further comprising evaluating the design with a static checker.

10. The method of claim 9 wherein the static checker identifies at least some of the violations for the report.

11. The method of claim 1 wherein the violations are from one or more static verification tools.

12. The method of claim 1 further comprising presenting the plurality of violations based on the relationship.

13. The method of claim 1 wherein the identifying the primary contributor is based on data mining.

14. The method of claim 1 further comprising determining weights for aspects of the violations.

15. The method of claim 14 wherein the weights are for debug fields.

16. The method of claim 14 wherein the violation weights are based on the weights for the aspects of the violations.

17. The method of claim 14 wherein the primary contributor is related to an object or an attribute within the design and the sorting of the violations aids in identifying the primary contributor, wherein the primary contributor is further based on a frequency of violations relating to the object or the attribute within the design.

18. The method of claim 14 wherein the violation weights are based on a number of violations associated with an object in the design.

19. The method of claim 14 wherein the violation weights are based on a number of violations associated with an attribute in the design.

20. A computer system for design analysis comprising:
    a memory which stores instructions;
    one or more processors coupled to the memory wherein the one or more processors are configured to:
        determine, based on a report on violations for a design, a relationship between a plurality of the violations for the design where the relationship includes a proximity between the plurality of violations;
        calculate violation weights and sorting the violations based on the violation weights;
        identify a primary contributor to the plurality of the violations based on the relationship between the plurality of violations, where the primary contributor is related to an object within the design and where the identifying a primary contributor is based on a hot spot analysis for the design;
    annotate the design with violation-check tuples and where determination of the relationship between the plurality of the violations is based on the violation-check tuples; and
    wherein a weight, from the violation weights, is assigned to a design object based on the number of violations associated with the design object within the design and where the hot spot is identified based on the weight.

21. The system of claim 20 wherein the one or more processors are further configured to determine a root cause for the plurality of violations.

22. The system of claim 20 wherein the one or more processors are further configured to present the plurality of violations based on the relationship.

23. The system of claim 20 wherein the one or more processors are further configured to determine violation weights for aspects of the violations.

24. The system of claim 23 wherein the violation weights are based on a context factor.

25. A computer program product embodied in a non-transitory computer readable medium for design analysis comprising:
   code for determining, based on a report on violations for a design, a relationship between a plurality of the violations for the design where the relationship includes a proximity between the plurality of violations;
   code for calculating violation weights and sorting the violations based on the violation weights;
   code for identifying a primary contributor to the plurality of the violations based on the relationship between the plurality of violations, where the primary contributor is related to an object within the design and where the identifying a primary contributor is based on a hot spot analysis for the design;
   code for annotating the design with violation-check tuples and where the determining the relationship between the plurality of the violations is based on the violation-check tuples; and wherein a weight, from the violation weights, is assigned to a design object based on the number of violations associated with the design object within the design and where the hot spot is identified based on the weight.

26. The computer program product of claim 25 further comprising code for determining a root cause for the plurality of violations.

27. The computer program product of claim 25 further comprising code for presenting the plurality of violations based on the relationship.

28. The computer program product of claim 25 further comprising code for determining violation weights for aspects of the violations.

29. The computer program product of claim 28 wherein the violation weights are based on a context factor.

30. The computer program product of claim 25 wherein the proximity between the plurality of violations includes a physical or logical proximity.

* * * * *